(12) United States Patent
Yamamoto et al.

(10) Patent No.: US 7,517,720 B2
(45) Date of Patent: Apr. 14, 2009

(54) METHOD FOR PRODUCING ZNTE SYSTEM COMPOUND SEMICONDUCTOR SINGLE CRYSTAL, ZNTE SYSTEM COMPOUND SEMICONDUCTOR SINGLE CRYSTAL, AND SEMICONDUCTOR DEVICE

(75) Inventors: Tetsuya Yamamoto, Kochi (JP); Atsutoshi Arakawa, Kitaibaraki (JP); Kenji Sato, Takasaki (JP); Toshiaki Asahi, Saitama (JP)

(73) Assignee: Nippon Mining & Metals Co., Ltd., Tokyo (JP)

( * ) Notice: Subject to any disclaimer, the term of this patent is extended or adjusted under 35 U.S.C. 154(b) by 0 days.

(21) Appl. No.: 11/984,941

(22) Filed: Nov. 26, 2007

(65) Prior Publication Data

US 2008/0090327 A1    Apr. 17, 2008

Related U.S. Application Data

(62) Division of application No. 10/472,446, filed as application No. PCT/JP02/02642 on Mar. 20, 2002, now Pat. No. 7,358,159.

(30) Foreign Application Priority Data

| Apr. 4, 2001 | (JP) | ............................. 2001-106295 |
| Jul. 5, 2001 | (JP) | ............................. 2001-204419 |
| Oct. 29, 2001 | (JP) | ............................. 2001-330193 |
| Oct. 29, 2001 | (JP) | ............................. 2001-330194 |

(51) Int. Cl.
*H01L 21/00* (2006.01)
(52) U.S. Cl. .................. 438/102; 438/478; 438/505; 438/508
(58) Field of Classification Search ................ 438/102, 438/478, 505, 508
See application file for complete search history.

(56) References Cited

U.S. PATENT DOCUMENTS

| 3,218,203 | A | * | 11/1965 | Ruehrwein | .................. 117/89 |
| 3,218,204 | A | * | 11/1965 | Ruehrwein | .................. 117/99 |
| 3,224,912 | A | * | 12/1965 | Ruehrwein | .................. 117/89 |
| 3,261,726 | A | * | 7/1966 | Ruehrwein | ................ 148/33.4 |
| 3,312,571 | A | * | 4/1967 | Ruehrwein | .................. 117/93 |
| 3,390,311 | A | * | 6/1968 | Aven et al. | .................. 257/78 |
| 3,732,471 | A | | 5/1973 | Hou et al. | |
| 3,820,988 | A | * | 6/1974 | Tan et al. | ................ 430/87 |
| 5,541,948 | A | * | 7/1996 | Krupke et al. | .............. 372/41 |
| 5,767,533 | A | | 6/1998 | Vydyanath | |
| 6,337,536 | B1 | * | 1/2002 | Matsubara et al. | .......... 313/498 |
| 6,407,405 | B1 | | 6/2002 | Sano et al. | |
| 6,993,872 | B2 | | 2/2006 | Katsuragawa | |
| 7,008,559 | B2 | | 3/2006 | Chen | |
| 7,067,072 | B2 | | 6/2006 | Chen | |
| 7,094,288 | B2 | | 8/2006 | Hosseini Teherani | |
| 7,203,209 | B2 | | 4/2007 | Young et al. | |
| 7,252,852 | B1 | | 8/2007 | Parkin | |
| 7,358,159 | B2 | * | 4/2008 | Yamamoto et al. | .......... 438/478 |
| 2003/0226499 | A1 | | 12/2003 | Hosseini Teherani | |
| 2004/0074165 | A1 | | 4/2004 | Katsuragawa | |
| 2004/0112278 | A1 | | 6/2004 | Yoshida et al. | |
| 2004/0155255 | A1 | * | 8/2004 | Yamamoto et al. | .......... 257/102 |
| 2004/0227694 | A1 | | 11/2004 | Sun et al. | |
| 2006/0024928 | A1 | | 2/2006 | Seebauer et al. | |
| 2006/0108619 | A1 | | 5/2006 | Yoshida et al. | |
| 2006/0159132 | A1 | | 7/2006 | Young et al. | |
| 2006/0240277 | A1 | | 10/2006 | Hatwar et al. | |
| 2006/0240278 | A1 | | 10/2006 | Hatwar et al. | |
| 2006/0240992 | A1 | * | 10/2006 | Brandt et al. | ............... 505/844 |
| 2007/0001581 | A1 | | 1/2007 | Stasiak et al. | |
| 2007/0103068 | A1 | * | 5/2007 | Bawendi et al. | ............. 313/506 |
| 2007/0184573 | A1 | | 8/2007 | Krasnov | |
| 2008/0089831 | A1 | * | 4/2008 | Yamamoto et al. | .......... 423/508 |

(Continued)

FOREIGN PATENT DOCUMENTS

EP    823498 A1    2/1998

(Continued)

OTHER PUBLICATIONS

H. Ohsawa et al., P-Type ZnSe co-doped with Donors and Acceptors. Electronic Material Symposium, Jul. 8-10, 1998, pp. 91-92.

(Continued)

*Primary Examiner*—Laura M Menz
(74) *Attorney, Agent, or Firm*—Birch, Stewart, Kolasch & Birch, LLP

(57) ABSTRACT

The present invention relates to a method for producing an n-type ZnTe system compound semiconductor single crystal having high carrier concentration and low resistivity, the ZnTe system compound semiconductor single crystal, and a semiconductor device produced by using the ZnTe system compound semiconductor as a base member. Concretely, a first dopant and a second dopant are co-doped into the ZnTe system compound semiconductor single crystal so that the number of atoms of the second dopant becomes smaller than the number of atoms of the first dopant, the first dopant being for controlling a conductivity type of the ZnTe system compound semiconductor to a first conductivity type, and the second dopant being for controlling the conductivity type to a second conductivity type different from the first conductivity type. By the present invention, a desired carrier concentration can be achieved with a doping amount smaller than in earlier technology, and crystallinity of the obtained crystal can be improved.

9 Claims, No Drawings

U.S. PATENT DOCUMENTS

| | | | | |
|---|---|---|---|---|
| 2008/0090327 | A1* | 4/2008 | Yamamoto et al. | 438/102 |
| 2008/0090328 | A1* | 4/2008 | Yamamoto et al. | 438/102 |
| 2008/0090386 | A1* | 4/2008 | Yamamoto et al. | 438/478 |
| 2008/0090390 | A1* | 4/2008 | Yamamoto et al. | 438/505 |
| 2008/0163928 | A1* | 7/2008 | Sterzel | 136/264 |

FOREIGN PATENT DOCUMENTS

| | | |
|---|---|---|
| EP | 1 367 151 A1 | 12/2003 |
| EP | 1388597 A1 | 2/2004 |
| JP | 11-147799 A | 6/1999 |
| JP | 2002255698 A | 9/2002 |
| JP | 2004158528 A | 6/2004 |

OTHER PUBLICATIONS

Tetsuya Yamamoto, Doji Doping Ho ni yoru Wide Bandgap Handotai no Kadenshi Seigyo, New Diamond, No. 60, vol. 17, No. 1, Jan. 25, 2001, pp. 18-23, p. 18, right column, line 27 to p. 20, right column, line 16.

Osamu Matsumoto et al., Kiso Seicho Ho ni yori Sakusei shita pGata Dendo ZnS:N, ZnS:N, Ag, ZnS:N, Ag, Cl oyobi ZnS:N, Ag, In So no Tokusei Hikaku, The Institute of Electronics, Information and Communication Engineers Gijutsu Kenkyu Hokoku, Oct. 15, 1999, vol. 99, No. 361, pp. 7-12.

Hiroshi Yoshida, Daiichi Genriteki Shuho ni Motoduku Simulation Gijutsu ni Kansuru Kenkyu, Kagaku Gijutsu Shinko Choseihi Busshitsu.Zairyo Sekkei to tame no Kaso Jikken Gijutsu ni Kansuru Kenkyu Seika Hokokusho, Science and Technology Agency, Mar. 1999, pp. 52-58.

T. Yamamoto et al., Role of n-Type Codopants on Enhancing p-Type Dopants Incorporation . . . ; Nat. Res. Soc. Symp. Proc. vol. 510, 1998, pp. 67-72.

He Xing-ren: Wide Band—gap ZnSe Semiconductor Light—emitting Device; Semiconductor Optoelectronics; www.cnki.net, vol. 21 Supplement, Mar. 2000.

* cited by examiner

METHOD FOR PRODUCING ZNTE SYSTEM COMPOUND SEMICONDUCTOR SINGLE CRYSTAL, ZNTE SYSTEM COMPOUND SEMICONDUCTOR SINGLE CRYSTAL, AND SEMICONDUCTOR DEVICE

This application is a divisional application of U.S. application Ser. No. 10/472,446 filed on Oct. 21, 2003, now U.S. Pat. No. 7,358,159 which is the national phase under 35 U.S.C. §371 of PCT International Application No. PCT/JP02/02642 which has an International filing date of Mar. 20, 2002, which designated the United States of America.

TECHNICAL FIELD

The present invention relates to a method for producing an n-type ZnTe system compound semiconductor single crystal having high carrier concentration and low resistivity, the ZnTe system compound semiconductor single crystal, and a semiconductor device produced by using the ZnTe system compound semiconductor as a base member.

BACKGROUND ART

Presently, a ZnTe system compound semiconductor single crystal is deemed as a material which can be applied to light-emitting devices such as green light-emitting diode and the like. However, the Group II-VI compound semiconductor is a material difficult to control a conductivity type necessary as the light-emitting diode, and usable materials therefore are limited.

For example, there is known a pn-junction type diode produced by using a ZnSe system compound semiconductor crystal obtained by growing a number of layers of ZnSe system mixed crystal thin films by the molecular beam epitaxy method on a GaAs crystal substrate. Since the ZnSe system compound semiconductor crystal is believed that it is difficult to be controlled to a p-type semiconductor under thermal equilibrium status, it has been formed by using a special apparatus called radical particle beam source.

The p-type ZnSe compound semiconductor crystal obtained by the above-described method is, however, low in ratio of activation of the dopant (a ratio of doped dopant effectively activated as a carrier) and is not readily obtainable as a low-resistivity crystal. Therefore, it cannot be said that the p-type ZnSe system compound semiconductor crystal is sufficient to be used as a material of the light-emitting devices. Further, when a dopant is introduced in the crystal in order to control the conductivity type, defects which inhibit the dopant activation is also introduced in the crystal simultaneously. Thereby, there is a problem such that the crystallinity deteriorates according to these defects. Therefore, it is difficult to produce highly-reliable light-emitting devices by using the p-type ZnSe compound semiconductor single crystal.

On the other hand, as for the ZnTe system compound semiconductor, there is known a problem such that the n-type semiconductor thereof cannot be obtained as a low-resistivity crystal due to difficulty in increasing the carrier concentration, although the p-type semiconductor can be obtained easily. That is, a ZnTe system compound semiconductor is generally known as being obtainable as an n-type semiconductor by using epitaxial growth techniques such as the molecular beam epitaxy method (MBE), metal-organic chemical vapor deposition method (MOCVD) and the like, and by doping a Group 13 (3B) element such as Al (aluminum), Ga (gallium) or In (indium) into the ZnTe system compound crystal. However, in earlier technology, it is impossible to obtain an n-type semiconductor since the purity of the semiconductor raw materials is bad.

In recent years, according to improvements of highly-purifying the semiconductor raw materials and epitaxial growth techniques, it becomes possible to achieve an n-type ZnTe system semiconductor. Increase in the amount of addition of dopant therein, however, increases the self-compensation effect and cannot increase the carrier concentration, or rather, can even decrease the carrier concentration, so that a problem of reducing the resistivity still remains unsolved.

For example, an n-type ZnTe system compound semiconductor produced by doping Cl (chlorine) by the MBE method is found to have a carrier concentration of $\sim 3 \times 10^{16}$ cm$^{-3}$, and that produced by doping Al by the MOCVD method is found to have a carrier concentration of $\sim 4 \times 10^{17}$ cm$^{-3}$. Thus, when an amount not so affective to the crystallinity is doped, the limitation of a carrier concentration is $10^{17}$ cm$^{-3}$.

That is, in order to produce a semiconductor device having good characteristics, a carrier concentration of not less than $10^{18}$ cm$^{-3}$ is required, so that the currently obtainable n-type ZnTe system compound semiconductor is not suitable as a material for such a device.

Moreover, no experiments have been made on controlling the conductivity type of crystal materials having hetero structures required to produce a semiconductor device. From these situations, any light-emitting diodes using Group II-VI compound semiconductors other than ZnSe system compound semiconductor have not been put into practical use at present.

Meanwhile, a technique for controlling conductivity of semiconductors by co-doping is recently proposed, and effects of the technique were demonstrated for GaN and ZnO system materials (New Diamond, Edition 60, Vol. 17, No. 1, p. 18-23).

The co-doping method refers to a method of obtaining a semiconductor with a desired conductivity type, in which a first dopant for obtaining n-type (or p-type) conductivity and a second dopant for obtaining p-type (or n-type) conductivity in an amount approximately half of that of the first dopant are introduced together into a crystal. This method is successful in making dopant levels in the forbidden band shallower, and thus in increasing the carrier concentration.

Further, although the amount of dopants soluble into a crystal is generally limited by repulsive force between the dopants when the dopants are added at high concentrations into the crystal, the co-doping method is successful in increasing the amount of dopants soluble into the crystal since the repulsive force between the first dopants is moderated by attractive force with the second dopant, and thus in obtaining the crystal with a lower resistivity.

In addition, although the first dopant releases a carrier and makes itself ionized, scattering of the carrier is suppressed since Coulomb field in the crystal will be screened by the second dopant. This makes it possible to add the dopants at high concentrations without lowering the carrier mobility, and to obtain a semiconductor crystal having low resistivity.

As has been described in the above, the co-doping method is expected that it can theoretically realize low resistivity of semiconductor crystals.

Here, a demonstrative experiment of the co-doping method applied to GaN compound semiconductor will be explained briefly.

In earlier technology, it has been understood that production of p-type semiconductor of GaN compound is very difficult. That is, in a GaN compound semiconductor, generally, Mg (magnesium) is introduced as a p-type dopant. However, it has not readily been obtained as a p-type semiconductor having low resistivity since Mg has a comparatively high level in the forbidden band, and the vacancies cannot fully be activated at normal temperature as being indicated by the Fermi-Dirac statistics.

However, it was expected from calculations based on the theory of the co-doping that doping of Mg, which is a p-type dopant, together with O (oxygen), which can serve as an n-type dopant, in an amount approximately half of that of Mg would be effective. It was practically observed that co-doping of O and Mg in the MOCVD method resulted in increase in the carrier concentration by about two orders of magnitude. No decrease in the carrier mobility in association with the increase in the carrier concentration was observed.

The theory of the co-doping was thus demonstrated for GaN compound semiconductor, and was confirmed to be effective for obtaining semiconductor having low resistivity.

However, the above-described co-doping method has not theoretically nor experimentally been examined yet for ZnTe system compound semiconductor, and whether or not the method is effective for controlling the conductivity type of the ZnTe system compound semiconductor remains unsolved.

It is therefore an object of the present invention to provide a method for producing an n-type ZnTe system compound semiconductor single crystal having high carrier concentration and low resistivity, the ZnTe system compound semiconductor single crystal, and a semiconductor device having excellent characteristics, which is produced by using the ZnTe system compound semiconductor as a base member.

DISCLOSURE OF THE INVENTION

The invention according to one embodiment is a method for producing a ZnTe system compound semiconductor single crystal, comprising: co-doping a first dopant and a second dopant into the ZnTe system compound semiconductor single crystal so that a number of atoms of the second dopant becomes smaller than a number of atoms of the first dopant, the first dopant being for controlling a conductivity type of the ZnTe system compound semiconductor to a first conductivity type, and the second dopant being for controlling the conductivity type to a second conductivity type different from the first conductivity type, when performing epitaxial growth of the ZnTe system compound semiconductor single crystal on a substrate. The ZeTe system compound herein means a compound containing at least either of Zn, which is a Group 12 (2B) element, and Te, which is a Group 16 (6B) element, and substantially establishing lattice matching with ZnTe.

The method of co-doping the aforementioned two dopants (co-doping method) into the crystal makes it possible to control the conductivity type of the ZnTe system compound semiconductor in a comparatively easy manner. That is, according to the co-doping method, the ratio of activation of the dopants (ratio of doped dopants effectively activated as carriers) becomes high, so a desired carrier concentration can be achieved with that a doping amount smaller than that in the earlier technology, and also the crystallinity of the obtained crystal can be improved.

In one embodiment, the first conductivity type is n-type, and the second conductivity type is p-type. The method is effective when applied for the case where an n-type ZnTe system compound semiconductor single crystal is produced.

In one embodiment, the first dopant is a Group 13 (3B) element, and the second dopant is a Group 15 (5B) element.

In one embodiment, the Group 13 (3B) element includes at least one of Al, Ga and In, and the Group 15 (5B) element includes at least one of N, P and As. Further, it is also allowable, for example, to dope Al together with Ga as the Group 13 (3B) elements, where it is appropriate in this case that the doping amount in terms of the number of atoms of the Group 15 (5B) element is set smaller than the total number of atoms of Al and Ga of the Group 13 (3B) elements. In addition, with regard to the Group 15 (5B) element, not only a single element selected from N, P and As, but two or more elements can be doped together if the number of doped atoms is smaller than the number of atomes of the Group 13 (3B) element(s).

In one embodiment, the first dopant is a Group 17 (7B) element, and the second dopant is a Group 1 (1A) element.

In one embodiment, the Group 17 (7B) element includes at least one of Cl, Br and I, and the Group 1 (1A) element includes at least Li.

In one embodiment, both of the first and second dopants are Group 14 (4B) elements, since the Group 14 (4B) elements can control the conductivity type of the ZnTe system compound semiconductor either to n-type and p-type depending on the position of atoms to be occupied. It is to be noted, however, that Si and Ge tend to occupy the position of Zn atom to thereby make the conductivity type of the ZnTe system compound semiconductor n-type, and C tends to occupy the position of Te atom to thereby make the conductivity type of the ZnTe system compound semiconductor p-type, so that the first dopant preferably includes at least one of Si and Ge, and the second dopant preferably includes at least C.

In one embodiment, a ZnTe crystal substrate is used as the substrate. In this case, it is preferable to grow ZnTe system compound semiconductor single crystal which establishes lattice matching with the ZnTe crystal substrate. For example, an exemplary lattice matching condition is preferably within 0.5%, and more preferably, within 0.2%.

In one embodiment, ZnTe, ZnMgSeTe, CdSeTe, CdZnSeTe, BeMgTe, BeZnMgTe or the like is grown by the method for producing the ZnTe system compound semiconductor single crystal previously described. When any one of the above-described ZnTe system compound semiconductor is grown on the ZnTe crystal substrate, it becomes possible to grow a high-quality crystal since the aforementioned lattice matching condition is satisfied. On the contrary, when a compound semiconductor which does not establish a lattice matching with the ZnTe crystal substrate is grown and the resultant semiconductor crystal is used for production of a semiconductor device, effects of the co-doping are undesirably reduced since there is a possibility that the photo-electric conversion efficiency deteriorates according to leakage current due to increase of defects, and that the life time deteriorates due to increase of defects during use of the semiconductor device.

In one embodiment, the ZnTe system compound semiconductor single crystal is formed on the ZnTe substrate by the molecular beam epitaxy method (MBE) or the chemical vapor deposition method (CVD method), and in particular by the metal-organic chemical vapor deposition method (MOCVD).

The invention according to one embodiment is a method for producing a ZnTe system compound semiconductor single crystal, comprising: co-doping a first dopant and a second dopant into the ZnTe system compound semiconductor single crystal, the first dopant being for controlling a conductivity type of the ZnTe system compound semiconductor to n-type and comprising a Group 13 (3B) element, and the second dopant comprising a Group 16 (6B) element having a bond energy with a Zn element equivalent to or larger than a bond energy between a Te element and the Zn element, when performing epitaxial growth of the ZnTe system compound semiconductor single crystal on a substrate.

In one embodiment, the second dopant is doped so that a number of atoms becomes not less than that of the first dopant and a concentration in the ZnTe system compound semiconductor single crystal becomes not more than 5 at %. That is, doping of the Group 16 (6B) element in an amount capable of attaining a concentration in the ZnTe compound semiconductor crystal of not less than 5 at % might be successful in obtaining the same effect but makes it difficult to establish lattice matching conditions or affects the band structure, so that doping so as to attain the concentration in the crystal of not more than 5 at % is practical. This facilitates establishment of the lattice matching conditions and makes it possible to suppress the adverse affects on the band structure.

In one embodiment, the Group 13 (3B) element includes at least one of Al, Ga and In, and the Group 16 (6B) element includes at least one of O (oxygen), S (sulfur) and Se (selenium).

In one embodiment, ZnTe, ZnMgTe, CdTe, CdZnTe, BeMgTe, BeZnMgTe or the like, for example, is grown by the method for producing the ZnTe system compound semiconductor single crystal previously described. The invention is also applicable to growth of ZnTe system compound semiconductor containing Se, such as ZnMgSeTe, CdSeTe and CdZnSeTe. In this case, since O and S are more advantageous in obtaining the effects of the co-doping as compared with Se, it is preferable to use O or S as the Group 16 (6B) element for the co-doping so as to attain a concentration in crystal of 5 at % or less.

The invention according to one embodiment is a method for producing a ZnTe system compound semiconductor single crystal, comprising: co-doping a first dopant and a second dopant into the ZnTe system compound semiconductor single crystal, the first dopant being for controlling a conductivity type of the ZnTe system compound semiconductor to n-type and comprising a Group 13 (3B) element, and the second dopant comprising a Group 2 (2A) element having a bond energy with a Te element equivalent to or larger than a bond energy between a Zn element and the Te element, when performing epitaxial growth of the ZnTe system compound semiconductor single crystal on a substrate.

The ZnTe compound herein means a compound containing at least either of Zn, which is a Group 12 (2B) element, and Te, which is a Group 16 (6B) element, substantially establishing lattice matching with ZnTe, and in which a vacancy of the Group 12 (2B) element is energetically more stable than a vacancy of the Group 16 (6B) element.

In one embodiment, the second dopant is doped so that a number of atoms becomes not less than a concentration of Zn vacancy (not less than ~$10^{18}$ cm$^{-3}$) and a concentration in the ZnTe system compound semiconductor single crystal becomes not more than 1 at %. That is, doping of the Group 2 (2A) element in an amount capable of attaining a concentration in the ZnTe compound semiconductor crystal of not less than 1 at % might be successful in obtaining the same effect but makes it difficult to establish lattice matching conditions or affects the band structure, so that doping so as to attain the concentration in the crystal of not more than 1 at % is practical. This facilitates establishment of the lattice matching conditions and makes it possible to suppress the adverse affects on the band structure.

In one embodiment, the Group 13 (3B) element includes at least one of Al, Ga and In, and the Group 2 (2A) element includes at least one of Be, Mg and Ca.

In one embodiment, ZnTe, CdTe, CdZnTe, ZnOTe, ZnSTe, ZnSeTe, CdSeTe, CdSTe, CdOTe, CdZnOTe, CdZnSTe, CdZnSeTe or the like, for example, is grown by the method for producing the ZnTe system compound semiconductor single crystal previously described. The invention is also applicable to growth of ZnTe system compound semiconductor containing Mg, such as ZnMgTe, ZnMgSeTe and the like. In this case, since Be is more advantageous in obtaining the effects of the co-doping as compared with Mg, it is preferable to use Be as the Group 2 (2A) element for the co-doping so as to attain a concentration in the crystal of 1 at % or less.

Although it is described in the above that the second dopant is preferably doped so that a number of atoms becomes not less than a concentration of Zn vacancy (not less than ~$10^{18}$ cm$^{-3}$) and a concentration in the ZnTe system compound semiconductor single crystal becomes not more than 1 at %, it is more preferable for an exemplary case where ZnTe is formed by epitaxial chemical vapor deposition method on the ZnTe crystal substrate that the second dopant is doped so that a number of atoms becomes not less than a concentration of Zn vacancy (not less than ~$10^{18}$ cm$^{-3}$) and a concentration in the ZnTe system compound semiconductor single crystal becomes not more than 0.2 at %. Thereby, it becomes possible to obtain an ZnTe epitaxial film well lattice-matched.

The invention according to one embodiment is a ZnTe system compound semiconductor single crystal obtained by the producing method previously described, comprising a carrier concentration of not less than $1\times10^{17}$ cm$^{-3}$, and a carrier mobility of not less than 300 cm$^2$/V·sec.

The invention according to one embodiment is the ZnTe system compound semiconductor single crystal comprising a carrier concentration is not less than $1\times10^{18}$ cm$^{-3}$ and a carrier mobility is not less than 130 cm$^2$/V·sec so as to attain more desirable characteristics as a material for semiconductor devices.

The invention according to one embodiment is the ZnTe system compound semiconductor single crystal further comprising a resistivity of not more than 0.05 Ω·m.

The ZnTe system compound semiconductor single crystal having such characteristics is realized as a low-resistivity, n-type semiconductor, and is useful as a material for semiconductor devices. Moreover, since the ratio of activation of dopants becomes high with the co-doping method, the doping amount can be suppressed to a small amount as compared with the doping amount of the method in the earlier technology. Therefore, the obtained ZnTe system compound semiconductor single crystal has a desirable crystallinity and is suitable as a material for semiconductor devices.

The invention according to one embodiment is a ZnTe system compound semiconductor single crystal doped with a first dopant comprising an element for occupying a Zn lattice position, an energy of the element when the Zn lattice position is occupied being more stable than an energy of the element when vacancy is formed at the Zn lattice position. In other words, this is a ZnTe system compound semiconductor single crystal configured so as to allow a constitutional element of the first dopant to occupy the Zn lattice position so as to be energetically stabilized than in the case where vacancy is formed at the Zn lattice position. The ZnTe system compound herein means a Group II-VI compound which contains at least Zn selected from the Group 12 (2B) elements and a Group 16 (6B) element, and is likely to produce vacancy defect of Zn.

The invention according to one embodiment is the ZnTe system compound semiconductor single crystal doped with the Group 1 (1A) element or Group 11 (1B) element suitable as the first dopant, where at least one of Ag, Cu, Li and Na may be doped, for example. However, since doping of Li and Na into the crystal in a highly pure status is practically difficult, Ag and Cu are more suitable as the first dopant, and Ag is still more energetically suitable.

The invention according to one embodiment is the ZnTe system compound semiconductor single crystal co-doped with the first dopant and a second dopant, the second dopant comprising an element for occupying a Te lattice position and for controlling a conductivity type of the ZnTe system compound semiconductor to p-type.

In one embodiment, the second dopant includes at least one of N, P and As, which are elements for occupying the Te lattice position.

The invention according to one embodiment is the p-type ZnTe compound semiconductor single crystal specifically having a p-type carrier concentration of not less than $1\times10^{18}$ cm$^{-3}$, and a carrier mobility of not less than 40 cm$^2$/V·sec.

The invention according to one embodiment is the ZnTe system compound semiconductor single crystal further comprising a resistivity of not more than 0.1 Ω·m.

The invention according to one embodiment is the ZnTe system compound semiconductor single crystal co-doped with the first dopant and a third dopant, where the third dopant is for controlling the conductivity type to n-type. This is successful in producing the n-type ZnTe system compound semiconductor excellent in the crystallinity.

In one embodiment, the third dopant includes at least one of Al, Ga, In and Cl, where it is necessary to keep concentration of the third dopant larger than that of the first dopant.

The invention according to one embodiment is the n-type ZnTe compound semiconductor single crystal comprising an n-type carrier concentration of not less that $1\times10^{18}$ cm$^{-3}$, and a carrier mobility of not less than 130 cm$^2$/V·sec.

The invention according to one embodiment is the ZnTe system compound semiconductor single crystal further comprising a resistivity of not more than 0.05 Ω·m.

As described in the above, doping of an element such as Ag, Cu or the like, for occupying the Zn lattice position into the ZnTe system compound semiconductor single crystal as the first dopant makes it possible to prevent Zn vacancy defect from being generated, and to obtain the ZnTe system compound semiconductor single crystal having only a small composite defect density due to the vacancy defect density and Zn vacancy.

Further, the ZnTe system compound semiconductor single crystals according to a number of the embodiments previously described can be exemplified by ZnTe, ZnMgTe, ZnMnTe, ZnCdTe, ZnBeTe, ZnMgSeTe, ZnBeMgTe, ZnCdSeTe and the like.

Further, a number of the embodiments previously described are effective not only for the ZnTe system compound semiconductor single crystal but also to Group II-VI compound semiconductor single crystals such as CdTe system compound semiconductor single crystal, BeTe system compound semiconductor single crystal and the like. In this case, doping of Ag or Cu as the first dopant can effectively suppress generation of the defects due to Cd vacancy or Be vacancy.

The invention according to one embodiment is a semiconductor device having the ZnTe compound semiconductor single crystal previously described as a base member. This semiconductor device can realize photo-electric conversion with a high quantum efficiency since the ratio of activation of the dopants in the semiconductor single crystal is high, and deep levels due to non-activated dopants are hardly generated. Moreover, elongation of the life time of the semiconductor devices can be expected since the contact resistance with electrodes is small, and therefore heat generation due to operating voltage can be reduced.

Hereinafter, the details of the present invention will be explained specifically.

In earlier technology, Al, Ga, In and the like, which are Group 13 (3B) elements, are singularly doped by using the epitaxial growth techniques such as the MBE method or MOCVD method in order to obtain an n-type semiconductor single crystal of ZnTe compound. It is, however, observed that increase in the doping amount of the dopant increases the self-compensation effect and cannot increase the carrier concentration, or even conversely, decreases the carrier concentration. Moreover, the doping in an amount not so affective to the crystallinity could only achieve a carrier concentration to limitation of $10^{17}$ cm$^{-3}$.

The present inventors therefore carried out doping according to the co-doping method in which Al, Ga or In, which is a Group 13 (3B) element, and N, P or As, which is a Group 15 (5B) element, were doped at a time so that the number of atoms of the Group 15 (5B) element became approximately half of the number of atoms of the Group 13 (3B) element, and found out that the method was successful in increasing the carrier concentration. In addition, assuming that the doping amount of the Group 13 (3B) element as 100, good results were obtained when the doping amount of the Group 15 (5B) element was 10 to 90.

In particular for the case where In was used as the 13 (3B) element, the carrier concentration could effectively be increased without causing lowering of the carrier mobility and formation of deep levels. This is supposedly because, in ZnTe, the covalent bond diameter of the Group 15 (5B) element which can be introduced by the co-doping is smaller than the covalent bond diameter of Te, so that high-concentration doping of Al or Ga, having a covalent bond diameter smaller than that of Zn, might increase the strain. On the contrary, In having a covalent bond diameter larger than that of Zn can ease the strain, and can supposedly enhance the effects of the co-doping.

It was further found that when Cl, Br or I, which is a Group 17 (7B) element, was used as the n-type dopant, the effects of the co-doping was obtained when Li, which is a Group 1 (1A) element, was used as the p-type dopant. Use of Group 1 (1A) element other than Li, which is Na for example, as the p-type dopant however failed in obtaining the effect of the co-doping. This is supposedly because Na having high ionicity cannot effectively function as the simultaneous dopant. In addition, assuming that the doping amount of the Group 17 (7B) element as 100, the doping amount of Li of 10 to 90 was successful in obtaining the n-type semiconductor having a carrier concentration higher than that attainable by singular doping of the Group 17 (7B) element.

Moreover, for the case where the Group 14 (4B) element is used as the dopant, use of Si and Ge as the n-type dopants, and C as the p-type dopant was successful in obtaining the effect of the co-doping because Si and Ge are likely to occupy positions of Zn atom to thereby make the conductivity type of the semiconductor n-type, and C is likely to occupy position of Te atom to thereby make the conductivity type of the semiconductor p-type. In addition, assuming that the doping amount of at least either of Si and Ge as 100, the doping amount of C of 10 to 90 was successful in obtaining the n-type semiconductor having a high carrier concentration.

The present inventors further investigated into the method for producing a ZnTe system compound semiconductor by using the co-doping method, and found out based on theoretical calculation that Zn vacancy can stably exist in the ZnTe system compound crystal. Further, the present inventors also confirmed that the ZnTe system compound semiconductor single crystal is energetically stabilized when the Group 13

(3B) element substitutes the Zn lattice position and is activated as an n-type dopant, and when the nearest-neighbor Zn lattice position becomes vacant.

Further, it was also made clear that low bond energy between Zn and Te allows Zn vacancy to diffuse through the lattice relatively easily, and tends to result in forming composite defects due to diffusion of the vacancy. Then, the present inventors discovered that the composite defects produces deep levels to thereby lower the ratio of activation of the dopants, and this makes it difficult to control the conductivity type of ZnTe to n-type. Thereby, it was expected that placement of an element having a large bond energy with Zn at the Te lattice position would stabilize the Zn vacancy, and would suppress generation of the composite defects caused by diffusion of the Zn vacancy.

In other words, the present inventors considered that substitution of the Te lattice position in the nearest neighbor of the Group 13 (3B) element, which serves as a dopant, with an element having a large bond energy with Zn would attract Zn to thereby prevent Zn vacancy from being generated. For example, when Al is doped, co-doping of O as an element having a large bond energy with Zn readily results in formation of Al—O bond in the crystal since O can readily bond with Al, and prevents a vacancy from being formed in the vicinity of the dopant since O has a large bond energy with Zn. It was therefore expected that generation of the composite defects would be suppressed and that the ratio of activation of the dopants would be improved.

It was then experimentally made clear that O, Se and S, which are Group 16 (6B) elements and belongs to the same group with Te element of the ZnTe system compound semiconductor, were preferable as the element having a large bond energy with Zn, and that co-doping of these elements together with the Group 13 (3B) element could effectively control the conductivity type of the ZnTe crystal. It was also found that the doping amount of the Group 16 (6B) element in terms of the number of atoms was preferably not less than that of the Group 13 (3B) element so as to attain a concentration in the crystal of not more than 5 at %.

The present inventors further investigated into suppression of formation of the Zn vacancy, and made clear that placement of an element having a large bond energy with Te at the Zn lattice position could energetically stabilize the Zn lattice position. That is, placement of an element having a large bond energy with Te at the Zn lattice position can suppress generation of the Zn vacancy and thus can suppress generation of the composite defects caused by diffusion of the Zn vacancy. It was also confirmed that, when the Group 13 (3B) element substitutes the Zn lattice position and was activated as the n-type dopant, the crystal was energetically stabilized when the nearest-neighbor Zn lattice position becomes vacant.

As described in the above, placement of an element having a large bond energy with Te at the Zn lattice position energetically stabilized the Zn lattice position, suppressed formation of Zn vacancy, made it less likely to produce composite defects due to diffusion of the Zn vacancy, and was successful in sufficiently improving the ratio of activation of the Group 13 (3B) element when it substituted the Zn lattice position and was activated as the n-type dopant.

Then, it was made clear from the experiments that Be, Mg and Ca, which are Group 2 (2A) elements, were suitable as the element having a large bond energy with Te, and doping of these elements could effectively control the conductivity type of the semiconductor. In particular, the bond energy of Be with Te was the largest, and Be was found to be most suitable for use in the co-doping. It was also made clear that the doping amount of the Group 2 (2A) element was preferable to be an amount so that the number of atoms would be not less than a Zn vacancy concentration (not less than $\sim 10^{18}$ cm$^{-3}$) and a concentration in the crystal would be not more than 1 at %.

It was also confirmed that the co-doping could be realized by adopting the MBE method, MOCVD method or LPE method as an epitaxial growth method of the ZnTe compound semiconductor crystal, where either method was successful in obtaining the effect of the co-doping. In particular, when adopting the MOCVD method, good results could be obtained. This is supposedly because the MOCVD method is excellent in controllability of the amount of dopant, and the dopant can thoroughly move over the substrate and can readily enter a stable site since the growth temperature is ensured at a relatively high level. It was also found that the growth temperature in the epitaxial growth of the ZnTe compound semiconductor single crystal was preferably set to not less than 350° C.

In addition, it was also found that use of a Group III-V compound system substrate such as GaAs substrate or the like or an oxide system substrate, such as sapphire substrate or the like, in the production of the ZnTe system compound semiconductor single crystal, or use of a Group II-VI compound substrate different from the ZnTe system compound to be grown thereon, was successful in obtaining desirable effects of the co-doping. However, it was difficult to obtain a highly-reliable element since lattice mismatching was caused.

The present inventors further thought that density of the Zn vacancy could be reduced if the Zn lattice position was occupied with an element energetically more stable than the energy for forming the Zn vacancy. The present inventors then carried out an experiment in which an element for occupying the Zn lattice position is introduced in addition to the p-type dopant which comprises the Group 15 (5B) element, and found out that the element was stabilized at the Zn lattice position where it occupied, and could reduce density of the Zn vacancy. It was also confirmed that reduction in density of the Zn vacancy suppressed generation of the composite defects due to the Zn vacancy, and reduced the crystal defect density.

It was also made clear that Ag, Cu or the like was appropriate as the element for occupying the Zn lattice position and having energy more stable than that for forming the Zn vacancy, and doping of the element as one dopant effectively could suppress the defects due to the Zn vacancy.

Thus, by co-doping at least one element of Ag and Cu, which are elements capable of occupying the Zn lattice position, with a dopant, such as nitrogen (N) or the like, for controlling the conductivity type, generation of the Zn vacancy could be suppressed even if N was doped in a large amount, and this was successful in preventing adverse effect of the defects due to the Zn vacancy, and in obtaining the semiconductor single crystal having a high carrier concentration.

It was also confirmed that Ag could effectively function as a p-type dopant since it has a slightly higher activation energy as the p-type dopant. That is, in comparison with the case where only N, As or P was introduced as the p-type dopant, the case where Ag was co-doped with the p-type dopant was successful in obtaining a p-type ZnTe compound semiconductor single crystal having a higher carrier concentration and lesser defects.

It was also confirmed that the n-type ZnTe semiconductor single crystal having high carrier concentration and less defects could be obtained by co-doping Al, Ga, In, Cl or the like as the n-type dopant with Ag or Cu in a concentration lower than the n-type dopant.

The present invention is completed based on the above-described findings, and is aimed at obtaining a ZnTe compound semiconductor single crystal having a desired carrier concentration, which is attainable only with a small doping amount by using the co-doping method when producing the ZnTe compound semiconductor single crystal, and having a low defect density.

BEST MODES FOR CARRYING OUT THE INVENTION

Hereinafter, preferred embodiments of the present invention will be explained with reference to the drawings.

Example 1

The present example relates to epitaxial growth of a ZnTe compound semiconductor single crystal according to the MOCVD method by using a p-type ZnTe crystal as a substrate, by which an n-type semiconductor was formed by the co-doping of In as the n-type dopant, and P as the p-type dopant.

First, a ZnTe buffer layer was formed on the p-type ZnTe crystal substrate. Semiconductor raw materials used herein were TMZn (trimethyl-zinc) as a Zn source, and TETe (triethyl-tellurium) as a Te source.

Next, on the ZnTe buffer layer, an n-type ZnTe compound semiconductor layer doped with In and P was formed. At that time, TMIn (trimethyl-indium) was used as an In source, which is an n-type dopant, and $PH_3$ was used as a P source, which is a p-type dopant. In addition, the doping amount of In was adjusted so as to attain a carrier concentration in the crystal of $\sim 10^{19}$ $cm^{-3}$, and the doping amount of P was adjusted to approximately half of that of In.

Then, the n-type ZnTe compound semiconductor layer was epitaxially grown to a thickness of 1 μm, the grown crystal was taken out from a crystal growth apparatus, and the carrier concentration was measured by the Van der Pauw. As a result, the n-type carrier concentration was found to be $\sim 5 \times 10^{18}$ $cm^{-3}$. The carrier mobility was found to be 200 $cm^2/V\cdot sec$, which was sufficiently high.

Further, measurement of dopant concentrations in the crystal using a SIMS (secondary ion mass spectrometer) showed an In concentration of $\sim 10^{19}$ $cm^{-3}$, and a P concentration of 30 to 40% of the In concentration.

For comparison, similar measurement was made also on a ZnTe compound semiconductor produced by singular doping of In as an n-type dopant. The n-type carrier concentration was found to be $\sim 10^{16}$ $cm^{-3}$, and the carrier mobility was found to be 10 $cm^2/V\cdot sec$, which was low.

It was also found that a P concentration of as low as approximately 1% of the In concentration in the co-doping of In and P resulted in an n-type carrier concentration remained as low as $\sim 10^{16}$ $cm^{-3}$.

Example 2

The present example relates to epitaxial growth of a ZnTe compound semiconductor single crystal according to the MBE method by using a p-type ZnTe crystal as a substrate, by which an n-type semiconductor was formed by the co-doping of Cl as the n-type dopant, and Li as the p-type dopant.

First, a ZnTe buffer layer was formed on the p-type ZnTe crystal substrate. Semiconductor raw materials used herein were a high-purity Zn metal as a Zn source, and a high-purity Te metal as a Te source.

Next, on the ZnTe buffer layer, an n-type ZnTe compound semiconductor layer co-doped with Cl and Li was formed. At that time, $ZnCl_2$ was used as a Cl source, which is an n-type dopant. The doping amount of Cl was adjusted so as to attain a carrier concentration in the crystal of $\sim 10^{19}$ $cm^{-3}$, and the doping amount of Li was adjusted to approximately half of that of Cl.

Then, the n-type ZnTe compound semiconductor layer was epitaxially grown to a thickness of 1 μm, the grown crystal was taken out from a crystal growth apparatus, and the carrier concentration was measured by the Van der Pauw. As a result, the n-type carrier concentration was found to be $\sim 5 \times 10^{18}$ $cm^{-3}$. Further, the carrier mobility was found to be 250 $cm^2/V\cdot sec$, which was sufficiently high.

Moreover, as a result of evaluation of photoluminescence characteristics of the semiconductor crystal, almost no light emission from deep levels was confirmed. Further, as a result of measurement of dopant concentrations in the crystal by SIMS, a Cl concentration was $\sim 10^{19}$ $cm^{-3}$, and a Li concentration was 60 to 70% of the Cl concentration.

For comparison, similar measurement was made also on a ZnTe compound semiconductor produced by singular doping of Cl as an n-type dopant. The n-type carrier concentration was found to be $\sim 5 \times 10^{16}$ $cm^{-3}$, and the carrier mobility was found to be 10 $cm^2/V\cdot sec$, which was low. Further, a photoluminescence evaluation of the substrate showed a broad deep level on the long wavelength side.

Example 3

The present example relates to epitaxial growth of a ZnTe compound semiconductor single crystal according to the MOCVD method by using a p-type ZnTe crystal as a substrate, by which an n-type semiconductor was formed by the co-doping of In as the n-type dopant, and N as the p-type dopant.

First, a p-type ZnTe buffer layer was formed on the p-type ZnTe substrate, and further thereon, a p-type ZnMgSeTe cladding layer was formed.

Semiconductor raw materials used herein were TMZn (trimethyl-zinc) as a Zn source, and $H_2Te$ as a Te source. As a N source, which is a p-type dopant, $NH_3$ was used.

Next, on the p-type ZnMgSeTe cladding layer, an undoped CdZnSeTe active layer was grown.

Next, on the CdZnSeTe active layer, an n-type ZnMgSeTe cladding layer co-doped with In and N was formed. Further on the ZnMgSeTe cladding layer, an n-type ZnTe contact layer co-doped with In and N was formed, to thereby produce the ZnTe system compound semiconductor single crystal. In addition, in the co-doping, the doping amount of N was adjusted to approximately half of that of In.

Then, from measurement of carrier concentrations of thus obtained ZnTe system compound semiconductor single crystal, carrier concentration of the n-type ZnMgSeTe cladding layer was found to be $7 \times 10^{17}$ $cm^{-3}$, and that of the n-type ZnTe contact layer was found to be $5 \times 10^{18}$ $cm^{-3}$.

Thereafter, an Au (gold) electrode was formed on the ZnTe crystal substrate side, and a W (tungsten) electrode was formed on the n-type ZnTe contact layer side, to thereby produce a light-emitting diode.

Thus obtained light-emitting diode was energized, and the emission characteristics were evaluated, where green light emission with a high luminance was observed at an operating voltage of 2.5 V. The diode was also expected to have a long life time because contact resistance between the n-type ZnTe contact layer and W electrode was very small and heat generation could be reduced.

For comparison, a ZnTe system compound semiconductor single crystal having an n-type ZnTe compound semiconductor layer doped singularly with In as the n-type dopant was formed. From measurement, carrier concentration of the n-type ZnTe compound semiconductor layer was found to be ~$10^{16}$ cm$^{-3}$. Further, a light-emitting diode produced by using the ZnTe system compound semiconductor single crystal was also found to have an operating voltage of as high as 5 V, which was higher than that of the light-emitting diode of the present embodiment, and further, was found to show light emission from the deep levels and the emission efficiency lowered. Further, since deterioration was observed at the electrode portion on the n-type ZnTe contact layer side due to heat generation, the element was judged as having difficulty in elongation of the life time.

The present invention is not limited to the above-described Examples. For example, combinations of the dopants adopted to the co-doping may be any combinations of an n-type dopant and a p-type dopant, where the n-type dopant containing at least one of Al, Ga and In, which are Group 13 (3B) elements, and the p-type dopant containing at least one of N, P and As, which are Group 15 (5B) elements. Moreover, they may be any combinations of an n-type dopant and a p-type dopant, where the n-type dopant containing at least one of Cl, Br and I, which are Group 17 (7B) elements, and p-type dopant comprising Li, which is a Group 1 (1A) element. Further, a combination of an n-type dopant comprising Si and Ge, and a p-type dopant comprising C is also allowable.

Although the amount of the p-type dopant used for the co-doping was adjusted as half of that of the n-type dopant in the present Examples, assuming the amount of doping of the n-type dopant as 100, the doping amount of the p-type dopant may be adjusted within a range from 10 to 90. Further, the growth temperature during the epitaxial growth of the ZnTe compound semiconductor crystal is preferably set to not less than 350° C.

Further, besides the ZnTe compound semiconductor and ZnMgSeTe compound semiconductor explained in Examples 1, 2 and 3, the present invention is also applicable to production of n-type semiconductors such as CdSeTe, CdZnSeTe, BeMgTe and BeZnMgTe, which are systems capable of ensuring lattice matching with ZnTe.

Example 4

The present example relates to epitaxial growth of a ZnTe compound semiconductor single crystal according to the MOCVD method by using a p-type ZnTe crystal as a substrate, by which an n-type semiconductor was formed by using In as the n-type dopant, and S as Group 16 (6B) element to be co-doped therewith.

First, a ZnTe buffer layer was formed on the p-type ZnTe crystal substrate. Semiconductor raw materials used herein were TMZn (trimethyl-zinc) as a Zn source, and TETe (triethyl-tellurium) as a Te source.

Next, on the ZnTe buffer layer, an n-type ZnTe compound semiconductor layer co-doped with In and S was formed. At that time, TMIn (trimethyl-indium) was used as an In source, which is an n-type dopant, and H$_2$S was used as a S source, which is a Group 16 (6B) element. In addition, the doping amount of In was adjusted so as to attain a carrier concentration in the crystal of ~$10^{19}$ cm$^{-3}$, and the doping amount of S was adjusted so as to attain a concentration in the crystal of 1 at %.

Then, the n-type ZnTe compound semiconductor layer was epitaxially grown to a thickness of 1 μm, the grown crystal was taken out from a crystal growth apparatus, and the carrier concentration was measured by the Van der Pauw. As a result, the n-type carrier concentration was found to be ~$5 \times 10^{18}$ cm$^{-3}$. The carrier mobility was found to be 200 cm$^2$/V·sec, which was sufficiently high.

Further, as a result of measurement of dopant concentrations in the crystal using a SIMS (secondary ion mass spectrometer), an In concentration of ~$10^{19}$ cm$^{-3}$ and a S concentration of ~$10^{20}$ cm$^{-3}$ (1 at %) were confirmed.

For comparison, similar measurement was made also on a ZnTe compound semiconductor produced by singular doping of In as an n-type dopant. The n-type carrier concentration was found to be ~$10^{16}$ cm$^{-3}$, and the carrier mobility was found to be 10 cm$^2$/V·sec, which was low.

Example 5

The present example relates to epitaxial growth of a ZnBeMgTe compound semiconductor single crystal according to the MBE method by using a p-type ZnTe crystal as a substrate, by which an n-type semiconductor was formed by using Al as the n-type dopant, and O as Group 16 (6B) element to be co-doped therewith.

First, a ZnTe buffer layer was formed on the p-type ZnTe crystal substrate. Semiconductor raw materials used herein were a high-purity Zn metal as a Zn source, and a high-purity Te metal as a Te source.

Next, on the ZnTe buffer layer, an n-type ZnBeMgTe compound semiconductor layer co-doped with Al and O was formed. At that time, a high-purity Be (beryllium) was used as a Be source, a high-purity Mg was used as a Mg source, and a high-purity Te metal was used as a Te source. Moreover, a high-purity Al was used as an Al source as the n-type dopant, and oxygen in a form of radical beam was used as an O source, which is a Group 16 (6B) element. In addition, the doping amount of Al was adjusted so as to attain a carrier concentration in the crystal of ~$10^{19}$ cm$^{-3}$, and the amount of doping of O was adjusted so as to attain a carrier concentration in the crystal of ~$10^{20}$ cm$^{-3}$.

Then, the ZnBeMgTe compound semiconductor layer was epitaxially grown to a thickness of 1 μm, the grown crystal was taken out from a crystal growth apparatus, and the carrier concentration was measured by the Van der Pauw. As a result, the n-type carrier concentration was found to be ~$5 \times 10^{18}$ cm$^{-3}$. Further, the carrier mobility was found to be 250 cm$^2$/V·sec, which was sufficiently high.

Further, as a result of measurement of dopant concentrations in the crystal by SIMS, an Al concentration was ~$1 \times 10^{19}$ cm$^{-1}$ and an O concentration was ~$2 \times 10^{21}$ cm$^{-3}$. Moreover, almost no light emission from deep levels was confirmed by evaluation of photoluminescence characteristics of the semiconductor crystal.

Example 6

The present example relates to epitaxial growth of a ZnTe system compound semiconductor single crystal according to the MOCVD method by using a p-type ZnTe crystal as a substrate, by which an n-type semiconductor was formed by using Ga as the n-type dopant, and S as Group 16 (6B) element to be co-doped therewith.

First, a p-type ZnTe buffer layer was formed on the p-type ZnTe substrate, and further thereon, a p-type ZnMgSeTe cladding layer was formed. Semiconductor raw materials used herein were TMZn (trimethyl-zinc) as a Zn source, and H$_2$Te as a Te source. As a N source, which is a p-type dopant, NH$_3$ was used.

Thereafter, on the p-type ZnMgSeTe cladding layer, an undoped CdZnSeTe active layer was grown.

Next, on the CdZnSeTe active layer, an n-type ZnMgSeTe cladding layer co-doped with In and S was formed. Further on the ZnMgSeTe cladding layer, an n-type ZnTe contact layer co-doped with In and S was formed, to thereby produce the ZnTe system compound semiconductor. At that time, a high-purity Al was used as an Al source, which is an n-type dopant, and $H_2S$ was used as a S source, which is a Group 16 (6B) element. In addition, doping amount of S was adjusted so as to attain a carrier concentration in the crystal of 1 at %.

Then, as a result of measurement of carrier concentrations of thus obtained ZnTe system compound semiconductor single crystal, carrier concentration of the n-type ZnMgSeTe cladding layer was found to be $7\times10^{17}$ $cm^{-3}$, and that of the n-type ZnTe contact layer was found to be $5\times10^{18}$ $cm^{-3}$.

Thereafter, an Au electrode was formed on the ZnTe crystal substrate side, and a W electrode was formed on the n-type ZnTe contact layer side, to thereby produce a light-emitting diode.

Thus obtained light-emitting diode was energized, and the emission characteristics were evaluated, where green light emission with a high luminance was observed at an operating voltage of 2.5 V. Thus, the light-emitting diode of the present Example was successful in reducing the operating voltage by minimizing the contact resistance between the n-type ZnTe contact layer and W electrode. Therefore, the light-emitting diode can be expected to have a long life time since the power consumption can be reduced and thus heat generation can also be reduced.

For comparison, a ZnTe system compound semiconductor having an n-type semiconductor layer doped singularly with In as the n-type dopant was formed. From measurement, carrier concentration of the n-type contact layer was found to be $\sim10^{18}$ $cm^{-3}$. Further, a light-emitting diode produced by using the ZnTe system compound semiconductor single crystal was also found to have an operating voltage of as high as 5 V, which was higher than that of the light-emitting diode of the present example, and further, was found to show light emission from the deep levels and the emission efficiency lowered. Further, since deterioration was observed at the electrode portion on the n-type ZnTe contact layer side due to heat generation, the element was judged as having difficulty in elongation of the life time.

The present invention is not limited to the above-described Examples. For example, combinations of the dopants adopted to the co-doping may be those containing an n-type dopant which includes at least one of Al, Ga and In, which are Group 13 (3B) elements, and at least one of Se, S and O, which are Group 16 (6B) elements.

In addition, although the amount of the Group 16 (6B) element co-doped with the Group 13 (3B) element was adjusted so at to attain a concentration in the crystal of 1 at % to 2 at %, it may be adjusted to an amount not less than the doping amount of the n-type dopant, and so as to attain a concentration in the crystal of in a range not exceeding 5 at %. Further, the growth temperature during the epitaxial growth of the ZnTe compound semiconductor crystal is preferably set to not less than 350° C.

Further, besides the ZnTe compound semiconductor and ZnMgSeTe compound semiconductor explained in the present example, the present invention is also applicable to production of n-type semiconductors such as CdSeTe, CdZnSeTe and BeMgTe, which are systems capable of ensuring lattice matching with ZnTe.

Example 7

The present example relates to epitaxial growth of a ZnTe compound semiconductor single crystal according to the MBE method by using a p-type ZnTe crystal as a substrate, by which an n-type semiconductor was formed by using Al as the n-type dopant, and Be as the group 2 (2A) element to be co-doped with Al.

First, a ZnTe buffer layer was formed on the p-type ZnTe crystal substrate. Semiconductor raw materials used herein were a high-purity Zn metal as a Zn source, and a high-purity Te metal as a Te source.

Next, on the ZnTe buffer layer, an n-type ZnTe compound semiconductor layer co-doped with Al and Be was formed. At that time, a high-purity Al metal was used as an Al source, and a high-purity Be (beryllium) metal was used as a Be source, which is a Group 2 (2A) element. In addition, the doping amount of Al was adjusted so as to attain a carrier concentration in the crystal of $\sim10^{19}$ $cm^{-3}$, and the doping amount of Be was adjusted so as to attain a carrier concentration in the crystal of $\sim10^{18}$ $cm^{-3}$.

Then, the n-type ZnTe compound semiconductor layer was epitaxially grown to a thickness of 1 µm, the grown crystal was taken out from a crystal growth apparatus, and the carrier concentration was measured by the Van der Pauw. As a result, the n-type carrier concentration was found to be $\sim5\times10^{18}$ $cm^{-3}$. Further, the carrier mobility was found to be 200 $cm^2$/V·sec, which was sufficiently high.

Further, as a result of measurement of dopant concentrations in the crystal using a SIMS (secondary ion mass spectrometer), an Al concentration was $\sim10^{19}$ $cm^{-3}$, and a Be concentration was $\sim10^{18}$ $cm^{-3}$.

For comparison, similar measurement was made also on a ZnTe compound semiconductor produced by singular doping of Al as an n-type dopant. The n-type carrier concentration was found to be $\sim10^{17}$ $cm^{-3}$, and the carrier mobility was found to be 10 $cm^2$/V·sec, which was low.

Example 8

The present example relates to epitaxial growth of a ZnCdSeTe compound semiconductor single crystal according to the MBE method by using a p-type ZnTe crystal as a substrate, by which an n-type semiconductor was formed by using Ga as the n-type dopant, and Be as the group 2 (2A) element to be co-doped therewith.

First, a ZnTe buffer layer was formed on the p-type ZnTe substrate. Semiconductor raw materials used herein were a high-purity Zn metal as a Zn source, and a high-purity Te metal as a Te source.

Next, on the ZnTe buffer layer, an n-type ZnCdSeTe compound semiconductor layer co-doped with Ga and Be was formed. At that time, a high-purity Cd metal was used as a Cd source, a high-purity Se was used as a Se source, and a high-purity Te metal was used as a Te source. Moreover, a high-purity Ga metal was used as a Ga source as the n-type dopant, and a high-purity Be metal was used as a Be source, which is a Group 2 (2A) element. In addition, the doping amount of Ga was adjusted so as to attain a carrier concentration in the crystal of $\sim10^{19}$ $cm^{-3}$, and the doping amount of Be was adjusted so as to attain a carrier concentration in the crystal of $\sim10^{20}$ $cm^{-3}$.

Then, the ZnCdSeTe compound semiconductor layer was epitaxially grown to a thickness of 1 µm, the grown crystal was taken out from a crystal growth apparatus, and the carrier concentration was measured by the Van der Pauw. As a result, the n-type carrier concentration was found to be ~5×10$^{18}$ cm$^{-3}$. Further, the carrier mobility was found to be 250 cm$^2$/V·sec, which was sufficiently high.

Further, as a result of measurement of dopant concentrations in the crystal by SIMS, it was confirmed that a Ga concentration was ~1×10$^{19}$ cm$^{-3}$, and a Be concentration was ~10$^{20}$ cm$^{-3}$. Almost no light emission from deep levels was confirmed by evaluation of photoluminescence characteristics of the semiconductor crystal.

For comparison, similar measurement was made also on a ZnCdSeTe compound semiconductor produced by singular doping of Ga as an n-type dopant. The n-type carrier concentration was found to be ~8×10$^{16}$ cm$^{-3}$, and the carrier mobility was found to be 10 cm$^2$/V·sec, which was low. Further, formation of broad deep levels was confirmed based on a light emission of longer wavelength observed in evaluation of the photoluminescence characteristics.

Example 9

The present example relates to epitaxial growth of a ZnTe compound semiconductor single crystal according to the MBE method by using a p-type ZnTe crystal as a substrate, by which an n-type semiconductor was formed by using Al as the n-type dopant, and Be as the group 2 (2A) element to be co-doped therewith.

First, a p-type ZnTe buffer layer was formed on the p-type ZnTe substrate, and further thereon, a p-type ZnMgSeTe cladding layer was formed. Semiconductor raw materials used herein were a high-purity Zn metal as a Zn source, and a high-purity Te metal as a Te source. Further, as a N source, which is a p-type dopant, active nitrogen in a form of radical beam was used.

Thereafter, on the p-type ZnMgSeTe cladding layer, an undoped CdZnSeTe active layer was grown.

Next, on the CdZnSeTe active layer, an n-type ZnMgSeTe cladding layer co-doped with Al and Be was formed. Further on the ZnMgSeTe cladding layer, an n-type ZnTe contact layer co-doped with Al and Be was formed, to thereby produce the ZnTe system compound semiconductor. At that time, a high-purity Al metal was used as an Al source, which is an n-type dopant, and a high-purity Be metal as a Be source, which is a Group 2 (2A) element. In addition, the doping amount of Be was adjusted so as to attain a carrier concentration in the crystal of 1 at %.

Then, as a result of measurement of carrier concentrations of thus obtained ZnTe system compound semiconductor, carrier concentration of the n-type ZnMgSeTe cladding layer was found to be 7×10$^{17}$ cm$^{-3}$, and that of the n-type ZnTe contact layer was found to be 5×10$^{18}$ cm$^{-3}$.

Thereafter, an Au electrode was formed on the ZnTe substrate side, and a W electrode was formed on the n-type ZnTe contact layer side, to thereby produce a light-emitting diode.

Thus obtained light-emitting diode was energized, and the emission characteristics were evaluated, where green light emission with a high luminance was observed at an operating voltage of 2.5 V. Thus, the light-emitting diode of the present example was successful in reducing the operating voltage since the contact resistance between the n-type ZnTe contact layer and W electrode was extremely small. Therefore, the light-emitting diode can be expected to have a long life time since the power consumption can be reduced and heat generation can also be reduced.

For comparison, a ZnTe system compound semiconductor single crystal having an n-type semiconductor layer doped singularly with Al as the n-type dopant was formed. From measurement, carrier concentration of the n-type contact layer was found to be ~10$^{16}$ cm$^{-3}$. Further, a light-emitting diode produced by using the ZnTe system compound semiconductor was also found to have an operating voltage of as high as 5 V, which was higher than that of the light-emitting diode of the present embodiment, and was found to show light emission from the deep levels and the emission efficiency lowered. Further, since deterioration was observed at the electrode portion on the n-type ZnTe contact layer side due to heat generation, the element was judged as having difficulty in elongation of the life time.

The present invention is not limited to the above-described Examples. For example, combinations of the dopants adopted to the co-doping may be those containing an n-type dopant which includes at least one of Al, Ga and In, which are Group 13 (3B) elements, and at least one of Mg, Be and Ca, which are Group 2 (2A) elements. Also combinations containing Cl, which is a general n-type dopant, and at least one of Mg, Be and Ca, which are Group 2 (2A) elements are allowable.

Although the amount of the Group 2 (2A) element co-doped with the Group 13 (3B) element was adjusted so as to attain a concentration in the crystal of ~10$^{18}$ cm$^3$, it may be adjusted to an amount not less than the Zn vacancy concentration (~10$^{18}$ cm$^{-3}$), and so as to attain a concentration in the crystal of not exceeding 1 at %. Further, the growth temperature during the epitaxial growth of the ZnTe compound semiconductor crystal is preferably set to not less than 350° C.

Further, besides the ZnTe compound semiconductor and ZnMgSeTe compound semiconductor which establish lattice matching with the ZnTe substrate explained in the present example, the present invention is also applicable to production of n-type semiconductors such as CdTe, CdZnTe, ZnOTe, ZnSTe, ZnSeTe, CdSeTe, CdSTe, CdOTe, CdZnOTe, CdZnSTe, CdZnSeTeCdSeTe and CdZnSeTe.

Example 10

The present example relates to an example of a light-emitting diode as a semiconductor device according to the present invention. It is an example of a light-emitting diode using the ZnTe system compound semiconductor as a base member, where the ZnTe system compound semiconductor has a single-hetero pn junction formed by epitaxially growing the individual layers on a p-type ZnTe substrate.

In addition, dopants for the p-type ZnTe compound semiconductor layers used herein were Ag and N, and those for the n-type ZnTe compound semiconductor layers were Al and Ag.

First, on the p-type ZnTe substrate, 2.0 μm of a p-type ZnTe buffer layer doped with Ag and N so as to attain a carrier concentration of 1×10$^{18}$ cm$^{-3}$ was formed. Semiconductor raw materials used herein were a high-purity Zn metal as a Zn source, a high-purity Te metal as a Te source, a high-purity Ag metal as an Ag dopant source, and active nitrogen in a form of radical beam as an N dopant source.

Next, on the p-type ZnTe buffer layer, 1.0 μm of a ZnTe active layer doped with Ag and N so as to attain a carrier concentration of 1×10$^{17}$ cm$^{-3}$ was formed.

Next, on the ZnTe active layer, 2.0 μm of an n-type ZnMgSeTe compound semiconductor layer co-doped with Al and Ag was formed. At that time, a high-purity Al metal was used as an Al source, which is an n-type dopant. The doping amount of Al was adjusted so as to attain a carrier concentration in the crystal of ~10$^{18}$ cm$^{-3}$, and the doping amount of Ag was adjusted to approximately half of that of Al.

Next, on the n-type ZnMgSeTe layer, an n-type contact layer co-doped with Al and Ag so as to attain a carrier concentration of $5 \times 10^{18}$ cm$^{-3}$ was formed to have a thickness of 0.05 μm.

After the individual layers were thus formed, the grown crystal was taken out from a crystal growth apparatus, an Au electrode was formed on the ZnTe crystal substrate side, and a W electrode was formed on the n-type ZnTe contact layer side, to thereby produce a light-emitting diode.

The light-emitting diode was energized, and time-dependent changes in the emission intensity were measured, where almost no changes in the emission intensity were observed and stable emission characteristics were obtained.

For comparison, a light-emitting diode having a ZnTe buffer layer and active layer doped only with N as a dopant formed therein, was produced. Time-dependent changes in the emission intensity of the light-emitting diode were measured under the conditions same as those in the above-described measurement, and it was made clear that the light-emitting diode showed a large decrease in the emission intensity with time, as compared with that shown by the light-emitting diode of the present embodiment.

As described in the above, according to the present invention, the ratio of activation of the dopants (ratio of doped dopants effectively activated as carriers) can be increased by the method of co-doping two dopants (co-doping method) into the crystal, so that a desired carrier concentration can be achieved only by using a doping amount smaller than that in the earlier technology, and the crystallinity of the obtained crystal can be improved. Therefore, according to the semiconductor device using the ZnTe system compound semiconductor crystal of the present invention as a base member, photo-electric conversion with a high quantum efficiency can be realized since the ratio of activation of the dopants is high, and deep levels by non-activated dopants are hardly formed. Moreover, elongation of the life time of the semiconductor devices can be expected since the contact resistance with electrodes is small, and heat generation due to operating voltage can be reduced.

INDUSTRIAL APPLICABILITY

The present invention is not limited to the ZnTe system compound semiconductor single crystal, but possibly applicable to other Group II-VI compound semiconductor single crystals.

The invention claimed is:

1. A method for producing a ZnTe system compound semiconductor single crystal, comprising:
co-doping a first dopant and a second dopant into the ZnTe system compound semiconductor single crystal, the first dopant being for controlling a conductivity type of the ZnTe system compound semiconductor to n-type and comprising a Group 13 (3B) element, and the second dopant comprising a Group 16 (6B) element having a bond energy with a Zn element equivalent to or larger than a bond energy between a Te element and the Zn element, when performing epitaxial growth of the ZnTe system compound semiconductor single crystal on a substrate.

2. The method for producing the ZnTe system compound semiconductor single crystal as claimed in claim 1, wherein the second dopant is doped so that a number of atoms becomes not less than that of the first dopant and a concentration in the ZnTe system compound semiconductor single crystal becomes not more than 5 at %.

3. The method for producing the ZnTe system compound semiconductor single crystal as claimed in claim 1, wherein the Group 13 (3B) element includes at least one of Al, Ga and In, and the Group 16 (6B) element includes at least one of O, S and Se.

4. The method for producing the ZnTe system compound semiconductor single crystal as claimed in claim 2, wherein the Group 13 (3B) element includes at least one of Al, Ga and In, and the Group 16 (6B) element includes at least one of O, S and Se.

5. The method for producing the ZnTe system compound semiconductor single crystal as claimed in claim 1, wherein the ZnTe system compound semiconductor single crystal is any one of ZnTe, ZnMgTe, CdZnTe, BeMgTe or BeZnMgTe.

6. A method for producing a ZnTe system compound semiconductor single crystal, comprising:
co-doping a first dopant and a second dopant into the ZnTe system compound semiconductor single crystal, the first dopant being for controlling a conductivity type of the ZnTe system compound semiconductor to n-type and comprising a Group 13 (3B) element, and the second dopant comprising a Group 16 (6B) element having a bond energy with a Zn element equivalent to or larger than a bond energy between a Te element and the Zn element, when performing epitaxial growth of the ZnTe system compound semiconductor single crystal on a substrate.

7. The method for producing the ZnTe system compound semiconductor single crystal as claimed in claim 6, wherein the second dopant is doped so that a number of atoms becomes not less than that of the first dopant and a concentration in the ZnTe system compound semiconductor single crystal becomes not more than 5 at %.

8. The method for producing the ZnTe system compound semiconductor single crystal as claimed in claim 6, wherein the Group 13 (3B) element includes at least one of Al, Ga and In, and the Group 16 (6B) element includes at least one of O, S and Se.

9. The method for producing the ZnTe system compound semiconductor single crystal as claimed in claim 6, wherein the ZnTe system compound semiconductor single crystal is any one of ZnTe, ZnMgTe, CdZnTe, BeMgTe or BeZnMgTe.

* * * * *